United States Patent
Chudzik et al.

(10) Patent No.: US 9,673,108 B1
(45) Date of Patent: Jun. 6, 2017

(54) FABRICATION OF HIGHER-K DIELECTRICS

(71) Applicant: International Business Machines Corporation, Armonk, NY (US)

(72) Inventors: Michael P. Chudzik, Sunnyvale, CA (US); Min Dai, Mahwah, NJ (US); Dominic J. Schepis, Wappingers Falls, NY (US); Shahab Siddiqui, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/967,914

(22) Filed: Dec. 14, 2015

(51) Int. Cl.
*H01L 21/8238* (2006.01)
*H01L 21/28* (2006.01)
*H01L 27/092* (2006.01)
*H01L 29/51* (2006.01)

(52) U.S. Cl.
CPC ........ *H01L 21/823857* (2013.01); *H01L 21/28176* (2013.01); *H01L 27/092* (2013.01); *H01L 29/517* (2013.01)

(58) Field of Classification Search
USPC ................................. 438/199, 800
See application file for complete search history.

(56) References Cited

U.S. PATENT DOCUMENTS

| | | | |
|---|---|---|---|
| 6,538,278 B1 * | 3/2003 | Chau | H01L 27/0922 257/324 |
| 7,504,700 B2 | 3/2009 | Zhu et al. | |
| 8,269,286 B2 | 9/2012 | Hooker | |
| 8,324,090 B2 | 12/2012 | Masuoka et al. | |
| 8,865,551 B2 | 10/2014 | Ando et al. | |
| 8,912,611 B2 | 12/2014 | Kim et al. | |
| 8,941,183 B2 | 1/2015 | Yu et al. | |
| 9,029,959 B2 | 5/2015 | Brodsky et al. | |
| 9,048,307 B2 | 6/2015 | Song et al. | |
| 9,087,784 B2 | 7/2015 | Chudzik et al. | |
| 9,224,610 B2 | 12/2015 | Kim et al. | |
| 2005/0051856 A1 | 3/2005 | Ono et al. | |
| 2013/0187239 A1 * | 7/2013 | Chudzik | H01L 21/823842 257/369 |
| 2014/0113443 A1 | 4/2014 | Won et al. | |
| 2015/0206953 A1 | 7/2015 | Basker et al. | |
| 2015/0249015 A1 | 9/2015 | Ando et al. | |

OTHER PUBLICATIONS

Accelerated Examination Support Document, U.S. Appl. No. 15/045,474, signed Feb. 12, 2016, 10 pages.
Chudzik et al., "Fabrication of Higher-K Dielectrics," U.S. Appl. No. 15/045,474, filed Feb. 17, 2016.
List of IBM Patents or Patent Applications Treated as Related, signed Feb. 16, 2016, 2 pgs.

* cited by examiner

*Primary Examiner* — Timor Karimy
(74) *Attorney, Agent, or Firm* — Erik K. Johnson

(57) ABSTRACT

A method of manufacturing a semiconductor structure, and the resultant structure. The method includes forming an oxide layer above a substrate. The method includes forming a metal layer above the oxide layer. The method includes forming a first capping layer above the metal layer. A material forming the first capping layer may be titanium oxide, or titanium oxynitride. The method includes annealing the semiconductor structure. Annealing the semiconductor structure may result in diffusing a metal from the metal layer into the oxide layer.

17 Claims, 5 Drawing Sheets

US 9,673,108 B1

FABRICATION OF HIGHER-K DIELECTRICS

BACKGROUND

The present invention relates to manufacturing semiconductor devices, particularly to manufacturing gate dielectric layers for Field Effect Transistor (FET) structures.

FETs are commonly employed in electronic circuit applications. FETs may include a source region and a drain region spaced apart by a semiconductor channel region. In planar FETs, the semiconductor channel region may be a semiconductor substrate. In finFETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

BRIEF SUMMARY

An embodiment of the invention may include a method of forming a semiconductor structure. The method includes forming an oxide layer above a substrate. The method includes forming a metal layer above the oxide layer. The method includes forming a first capping layer above the metal layer. A material forming the first capping layer may be titanium oxide, or titanium oxynitride. The method includes annealing the semiconductor structure. Annealing the semiconductor structure may result in diffusing a metal from the metal layer into the oxide layer.

Another embodiment of the invention may include a method of forming a semiconductor structure. The method includes forming an oxide layer above a substrate. The method includes forming a stack above a first region of the oxide layer. The stack contains a first sandwich layer located on the oxide layer, a first metal layer located on the first sandwich layer, and a second sandwich layer located on the first metal layer. The method includes forming a second metal layer above a second region of the oxide layer. The method includes forming a first capping layer above the second metal layer. A material forming the first capping layer may be titanium oxide, or titanium oxynitride. The method includes annealing the semiconductor structure. Annealing the semiconductor structure may involve diffusing a first metal from the first metal layer into the first region of the oxide layer and diffusing a second metal from the second metal layer into the second region of the oxide layer.

Another embodiment of the invention may include a semiconductor structure containing a substrate and a first gate structure located above a first region of the substrate. The first gate structure includes a first gate dielectric layer located above the substrate and a first gate electrode located above the first gate dielectric layer. The first gate dielectric contains a uniform concentration of a high-k dielectric material and a first metal. Additionally, a top portion of the first gate dielectric further comprises titanium oxide.

Figure 1:
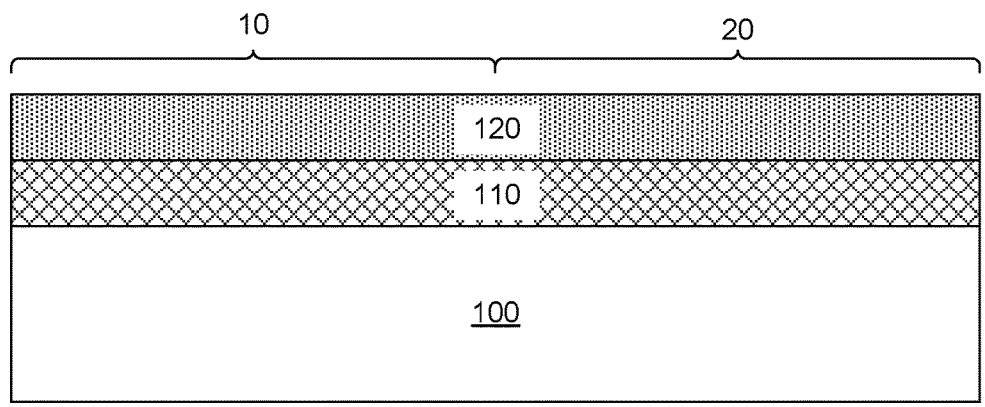
FIG. 1 is a cross-sectional view depicting depositing an oxide layer on a substrate, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Scaling down of semiconductor structures is a key characteristic in producing more powerful chips. However, as the scale of such structures becomes smaller, the structures may experience negative impacts due to the decreased sizes. For example, as a general rule, as the thickness of gate dielectrics becomes smaller, there is an increase in current leakage across the gate. To combat such current leakage, new materials and techniques, such as the embodiment below, are performed.

Referring to FIG. 1, an interface layer 110 may be formed on a semiconductor substrate 100, and a dielectric layer 120 may be formed above the interface layer110. The interface layer 110 may be made from any of several known oxides or oxynitrides derived from a semiconductor material. Semiconductor materials may include any elemental semiconductor known in the art, an alloy of at least two elemental semiconductor materials, a III-V compound semiconductor material, a II-VI compound semiconductor material, or any combination thereof. In an exemplary embodiment, the semiconductor material may be silicon. For example, the interface layer 110 may be made of silicon oxide or silicon oxynitride. The interface layer 110 may have a thickness, for example, ranging from approximately 1 nm to approximately 10 nm, preferably ranging from approximately 2 nm to approximately 4 nm. However, greater and lesser thicknesses of the interface layer 110 are explicitly contemplated.

In some embodiments, the interface layer 110 is deposited to form a gate dielectric of one or more FET structures. In an exemplary embodiment, deposition of the interface layer 110 may be performed by any suitable deposition technique such as, for example, atomic layer deposition (ALD), chemical vapor deposition (CVD), plasma enhanced CVD, spin-on deposition, or physical vapor deposition (PVD). In other embodiments, the interface layer 110 may be grown on substrate 100 using any known process.

A dielectric layer 120 may be deposited on the interface layer. In one embodiment, the dielectric layer 120 may include a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The dielectric layer 120 may be deposited over the interface layer 110 using any suitable deposition technique known the art, including, for example, ALD, CVD, PVD, MBD, PLD, or LSMCD. The dielectric layer 120 may have a thickness, for example, ranging from approximately 1 nm to approximately 10 nm, preferably ranging from approximately 2 nm to approximately 4 nm.

The substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 100 may be a bulk semiconductor substrate. In such embodiments, the substrate 100 may be approximately, but is not limited to, several hundred microns thick. For example, the substrate 100 may have a thickness ranging from approximately 0.5 mm to approximately 1.5 mm. In other embodiments the substrate 100 may be a semiconductor-on-insulator (SOI) substrate, where a buried insulator layer (not shown) separates a base substrate (not shown) from a top semiconductor layer. In other embodiments where a finFET structure is being fabricated, the substrate 100 may be a semiconductor fin. Additionally, the substrate may include separate regions containing either NFET or PFET gates. For illustrative simplicity, the drawings and description only refer to a single first region 10 and a single Second region 20, however multiple PFET gates and NFET gates may be formed on the same device.

Figure 2:
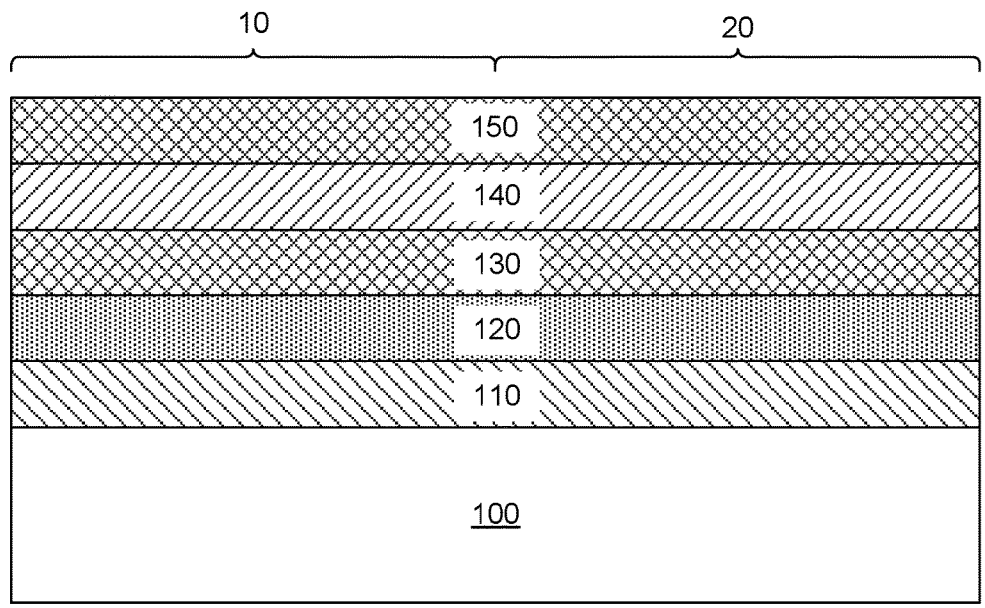
FIG. 2 is a cross-sectional view depicting depositing forming a metal layer, sandwiched between oxide layers, on a substrate, according to an exemplary embodiment.

Referring to FIG. 2, a first sandwich layer 130, a first metal layer 140 and a second sandwich layer 150 may be deposited on the dielectric layer 120. The first sandwich layer 130 and second sandwich layer 150 may be formed with the first metal layer 140 in the middle, where the first metal layer 140 contains a metal to dope the dielectric layer 120 during subsequent steps. The first sandwich layer 130 and second sandwich layer 150 may aid in driving the metal from the first metal layer 140 into the dielectric layer 120. In an embodiment, the first sandwich layer 130 and second sandwich layer 150 may contain materials such as, for example, titanium nitride. In an embodiment, the first metal layer 140 may contain materials such as, for example, aluminum. The first sandwich layer 130, a first metal layer 140 and a second sandwich layer 150 may be deposited using any suitable deposition technique known the art, including, for example, ALD, CVD, PVD, MBD, PLD, or LSMCD. The first sandwich layer 130 may have a thickness, for example, ranging from approximately 0.5 nm to approximately 3 nm. The first metal layer 140 may have a thickness, for example, ranging from approximately 0.1 nm to approximately 2 nm. The second sandwich layer 150 may have a thickness, for example, ranging from approximately 1 nm to approximately 3 nm.

Figure 3:
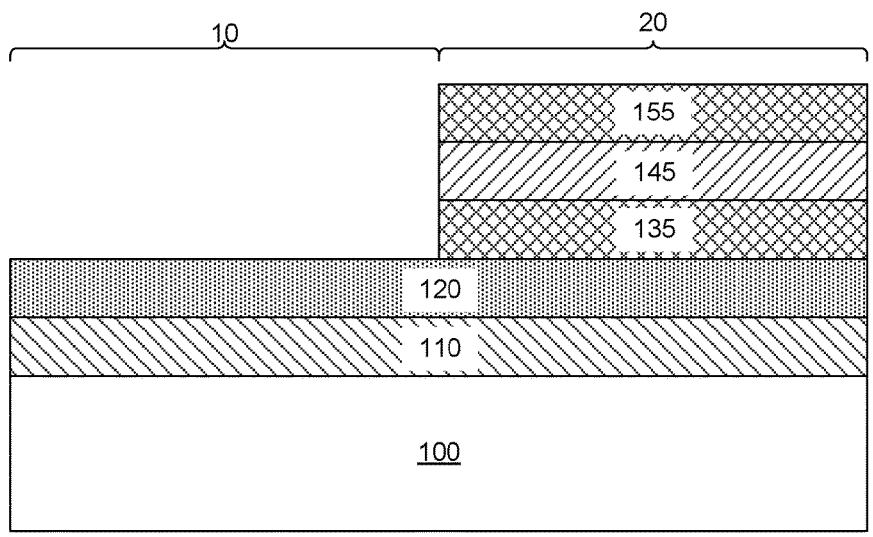
FIG. 3 is a cross-sectional view depicting exposing the oxide layer in a first region of the substrate, according to an exemplary embodiment.

Referring to FIG. 3, the second region 20 may be masked and the first sandwich layer 130, the first metal layer 140 and the second sandwich layer 150 may be removed from the first region 10, leaving second region first sandwich layer 135, second region metal layer 145 and second region second sandwich layer 155. In an exemplary embodiment, the second region mask 20 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The second region mask 20 may be deposited using any suitable method known in the art such as, for example, CVD, or spin-on deposition, and then may be etched to expose the first region 10. The mask may be etched using lithographic patterning above the second region 20 and etching techniques typically known in the art, such as RIE and plasma etching. The second region 20 may be masked and the first sandwich layer 130, the first metal layer 140 and the second sandwich layer 150 may be removed from the first region 10 by selectively etching the using an isotropic or an anisotropic etching process such as, for example, RIE, wet etching or plasma etching.

Figure 4:
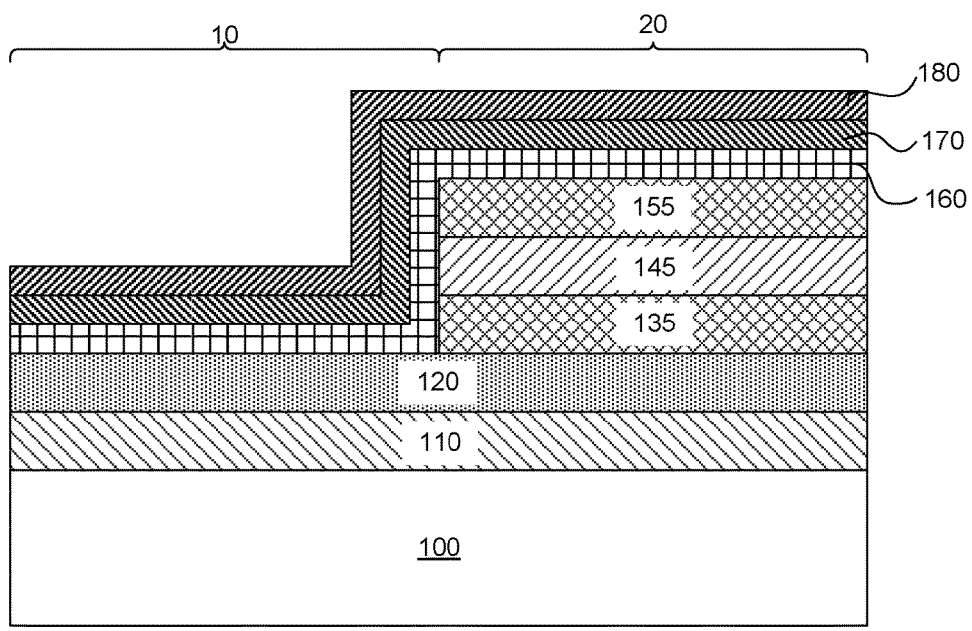
FIG. 4 is a cross-sectional view depicting depositing a metal layer and capping layer on a substrate, according to an exemplary embodiment.

Referring to FIG. 4, a second metal layer 160, a first cap 170 and a second cap 180 may be formed. The second metal layer 160 contains a metal to dope the dielectric layer 120 in the first region 10 during subsequent steps. The first cap 170 and second cap 180 may aid in driving the metal from the second metal layer 160 into the dielectric layer 120 in the first region 10. In an embodiment, first cap 170 may contain titanium oxide, or titanium oxynitride. In an embodiment, the second cap 180 may contain materials such as, for example, titanium nitride. In an embodiment, the second metal layer 160 may contain materials such as, for example, lanthanum. The second metal layer 160, the first cap 170 and the second cap 180 may be deposited using any suitable deposition technique known the art, including, for example, ALD, CVD, PVD, MBD, PLD, or LSMCD. The second metal layer 160 may have a thickness, for example, ranging from approximately 0.1 nm to approximately 10 nm, preferably ranging from approximately 0.2 nm to approximately 4 nm. The first cap 170 may have a thickness, for example, ranging from approximately 0.1 nm to approximately 1 nm. The second cap 180 may have a thickness, for example, ranging from approximately 0.1 nm to approximately 1 nm.

Figure 5:
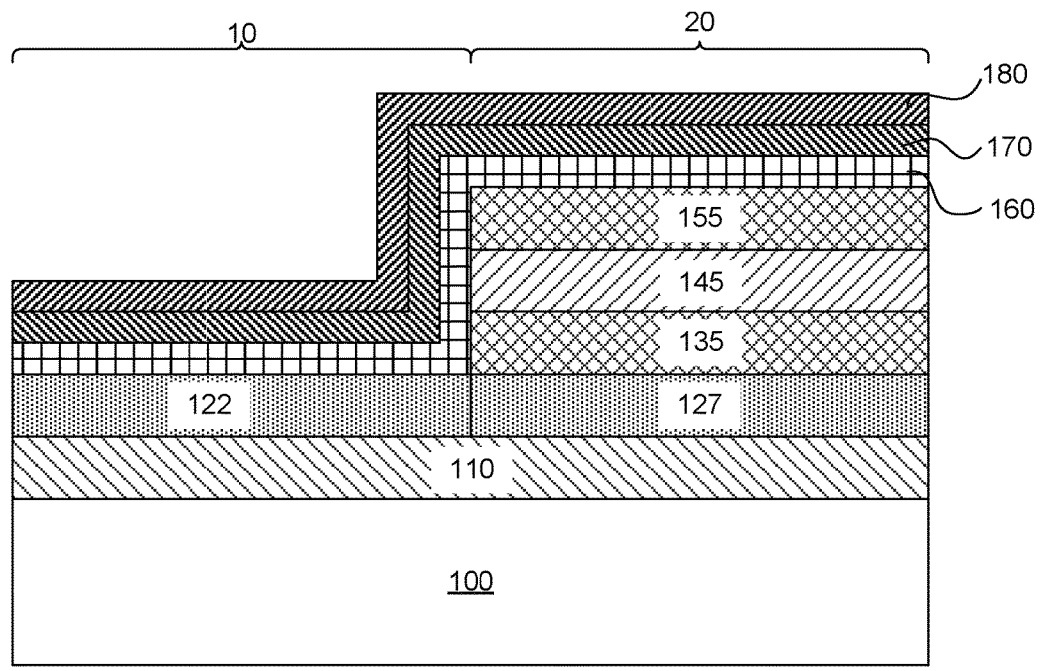
FIG. 5 is a cross-sectional view depicting annealing the structure of FIG. 4, according to an exemplary embodiment.

Referring to FIG. 5, the structure of FIG. 4 may be annealed causing the metal from the second metal 160 to diffuse into the dielectric layer 120 in the first region 10, forming a first region annealed dielectric layer 122, while the metal from the first metal 140 to diffuses into the dielectric layer 120 in the second region 20, forming a second region annealed dielectric layer 127. In an example embodiment, the lanthanum from the second metal layer 160 diffuses into, and intermixes with, the Hafnium Oxide in the dielectric layer 120 in the first region 10, creating a substantially uniform LaHfO material. Additionally, TiOx from the first cap 170 diffuses to a top surface, or a top portion, of the dielectric layer 120 in the first region 10. During the diffusion of the TiOx, or other first cap 170 materials, the lanthanum, or other second metal layer 160 materials, restrict the migration of oxygen through the dielectric layer 120. Thus, the interface layer 110 may maintain a consistent concentration of oxygen that was present prior to the anneal. Additionally, the restriction of the diffusion of oxygen may maintain the interface between the interface layer 110 and the substrate 100, as there is no additional oxygen present to migrate into the substrate 100 to form additional dielectric material. This may allow for improvement of gate leakage due to the TiOx surface layer, while maintaining a constant equivalent oxide thickness. The anneal may be performed at temperatures ranging from approximately 600° Celsius to approximately 1200° Celsius and may be annealed for approximately 10 to approximately 30 second. In some embodiments, the annealing temperature may be substantially uniform throughout the annealing period, however in other embodiments the annealing period include one or more ramping cycles where the temperature is decreased or increased.

Figure 6:
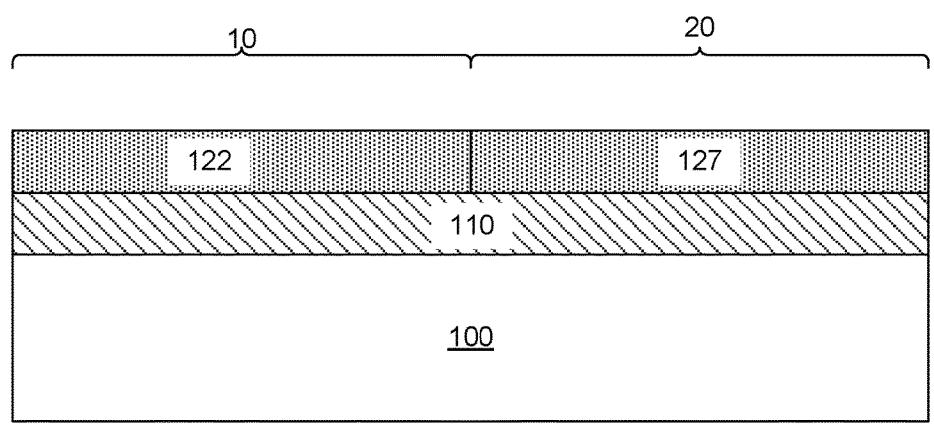
FIG. 6 is a cross-sectional view depicting removing the layers above the oxide layer, according to an exemplary embodiment.

Referring to FIG. 6, the second region first sandwich layer 135, second region metal layer 145 and second region second sandwich layer 155, second metal 160, first cap 170 and second cap 180 may be removed. Removal may be performed by any etching process that would selectively remove, the second region first sandwich layer 135, second region metal layer 145 and second region second sandwich layer 155, second metal 160, first cap 170 and second cap 180 with respect to the first region annealed dielectric layer 122 and the second region annealed dielectric layer 127. Removal may be performed using techniques such as, for example, RIE and plasma etching.

Figure 7:
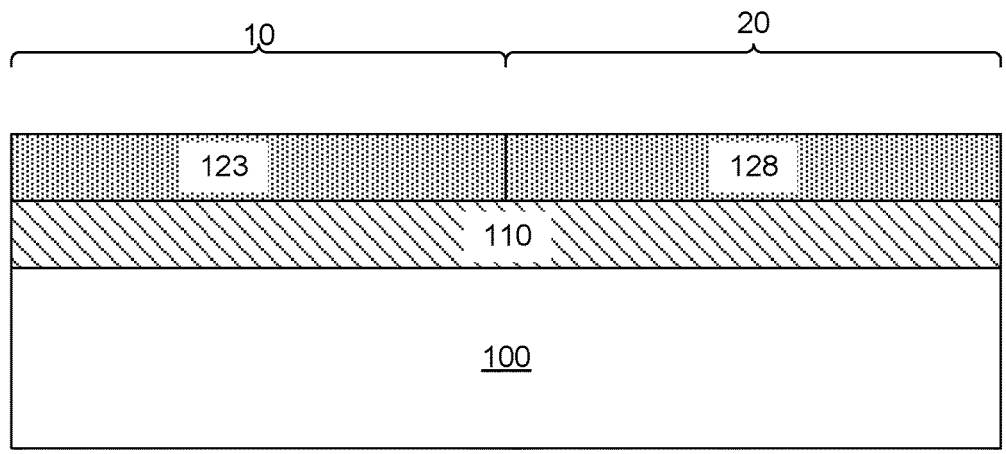
FIG. 7 is a cross-sectional view depicting nitriding the oxide layer, according to an exemplary embodiment.

Referring to FIG. 7, the first region annealed dielectric layer 122 and second region annealed dielectric layer 127 may be nitrided to form the first region nitrided dielectric layer 123 and second region nitrided dielectric layer 128. During nitridation, nitrogen is incorporated into the physically exposed portions of the first region annealed dielectric layer 122 and second region annealed dielectric layer 127 to convert the exposed metal oxide into a metal oxynitride. Nitridation may be a thermal nitridation process or a plasma nitridation process. Nitridation of the first region annealed dielectric layer 122 and second region annealed dielectric layer 127 may be performed by placing the structure into an annealing furnace with a suitable nitrogen environment such as, for example, NO, $N_2O$, $NH_3$ and $N_2$. Additionally, ion implantation may be used to introduce nitrogen into the first region annealed dielectric layer 122 and second region annealed dielectric layer 127.

Figure 8:
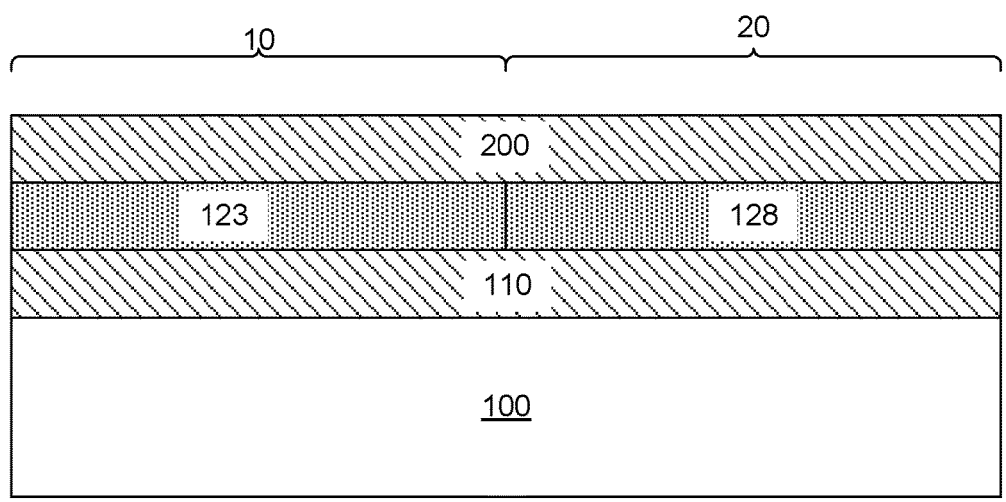
FIG. 8 is a cross-sectional view depicting depositing an electrode layer, according to an exemplary embodiment.

Referring to FIG. 8, a work function metal layer (not shown) and a gate electrode 200 may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating.

A gate electrode 200 may be deposited above the first region nitrided dielectric layer 123 and second region nitrided dielectric layer 128. The gate electrode 200 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The second replacement gate electrode 195 may be formed using any suitable metal deposition technique, including, for example, CVD, PVD, and ALD, sputtering, and plating.

Figure 9:
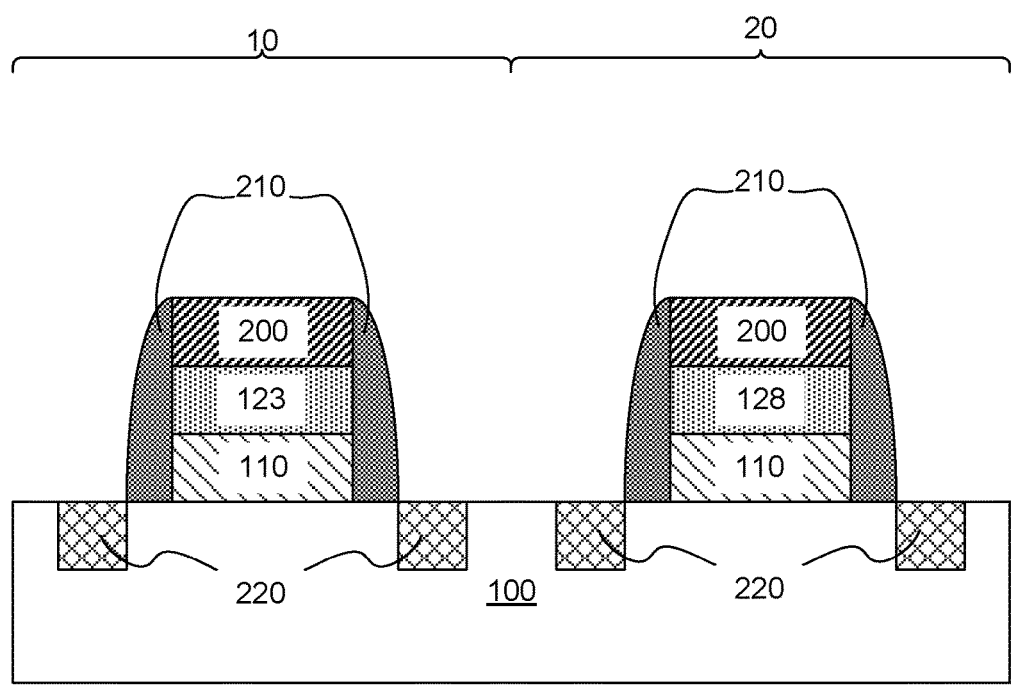
FIG. 9 is a cross-sectional view depicting field effect transistors created using the process of FIG. 1-FIG. 8 to create the gate structure, according to an exemplary embodiment.

Referring to FIG. 9, a field effect transistor (FET) is shown, wherein the gate is formed using the process set forth in FIG. 1-8. The formation of the FET may be done using known techniques for a gate first or a gate last process, where the gate formation follows the process set forth in FIG. 1-8. Further, the process set forth in FIG. 1-8 may be used with planar FET or finFET orientations. FIG. 9 shows a structure in a first region 10, having an interface layer 110 located on the surface of the substrate 100, the first region nitrided dielectric layer 123 above the interface layer 110 and the gate electrode 200 located above the first region nitrided dielectric layer 123, where the interface layer 110, the first region nitrided dielectric layer 123 and gate electrode 200 form a gate structure, and the gate structure is sandwiched by spacer pair 210. Further a source/drain region 220 may be embedded in the substrate 100 on either side of the gate structure. Additionally, FIG. 9 shows a structure in a second region 20, having an interface layer 110 located on the surface of the substrate 100, the second region nitrided dielectric layer 128 above the interface layer 110 and the gate electrode 200 located above the second region nitrided dielectric layer 128, where the interface layer 110, the second region nitrided dielectric layer 128 and gate electrode 200 form a gate structure, and the gate structure is sandwiched by spacer pair 210. Further a source/drain region 220 may be embedded in the substrate 100 on either side of the gate structure. The spacer pair 210 may be formed using techniques generally known in the art, from any suitable dielectric. Source/drain region 220 may be formed using techniques generally known in the art, and the materials used may be selected to improve characteristics of the operation of nFET or pFET devices. For example, n-dopant may be used in the source/drain region 220 located in the first region 10, while p-dopants may be used in the source/drain region 220 located in the second region 20.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of manufacturing a semiconductor structure, the method comprising:
   forming an oxide layer above a substrate;
   forming a metal layer above the oxide layer;
   forming a first capping layer above the metal layer, wherein a material forming the first capping layer comprises one or more of titanium oxide, and titanium oxynitride; and
   annealing the semiconductor structure, wherein annealing the semiconductor structure comprises diffusing a metal from the metal layer and the material from the first capping layer into the oxide layer, wherein the material from the first capping layer exists in the top portion of the oxide layer having a gradient with the highest concentration on the top surface of the oxide layer.

2. The method of claim 1, wherein annealing the semiconductor structure further comprises diffusing the material from the capping layer into the oxide layer.

3. The method of claim 2, wherein an oxide layer resulting from annealing the semiconductor structure further comprises:
   a metal from the metal layer uniformly distributed throughout the oxide layer; and
   a material from the capping layer located in a top portion of the oxide layer.

4. The method of claim 3, wherein the oxide layer comprises hafnium oxide, and wherein the metal of the metal layer comprises lanthanum, and wherein the material from the capping layer comprises titanium nitride.

5. The method of claim 1, wherein the oxide layer comprises hafnium oxide.

6. The method of claim 1, wherein a metal of the metal layer comprises lanthanum.

7. The method of claim 1, wherein the metal layer has a thickness between 0.1 nm and 10 nm.

8. The method of claim 1, wherein the first capping layer has a thickness between 0.1 nm and 1 nm.

9. The method of claim 1, further comprising forming a second capping layer on the first capping layer prior to annealing the semiconductor structure.

10. The method of claim 9, wherein a material of the second capping layer comprises titanium nitride.

11. The method of claim 9, the metal layer has a thickness between 0.1 nm and 10 nm, the first capping layer has a thickness between 0.1 nm and 1 nm and the second capping layer has a thickness between 0.1 nm and 1 nm.

12. The method of claim 1, further comprising:
   removing the metal layer and first capping layer; and
   nitriding the oxide layer.

13. A method of manufacturing a semiconductor structure, the method comprising:
   forming an oxide layer above a substrate;
   forming a stack above a first region of the oxide layer, wherein the stack comprises a first sandwich layer located on the oxide layer, a first metal layer located on the first sandwich layer, and a second sandwich layer located on the first metal layer;
   forming a second metal layer above a second region of the oxide layer;
   forming a first capping layer above the second metal layer, wherein a material forming the first capping layer comprises one or more of titanium oxide, and titanium oxynitride;
   annealing the semiconductor structure, wherein annealing the semiconductor structure comprises diffusing a first metal from the first metal layer into the first region of the oxide layer and diffusing a second metal from the second metal layer and the material from the first capping layer into the second region of the oxide layer, wherein the material from the first capping layer exists in the top portion of the oxide layer having a gradient with the highest concentration on the top surface of the oxide layer.

14. The method of claim 13, wherein a material of the first sandwich layer comprises titanium nitride.

15. The method of claim 13, wherein a material of the second sandwich layer comprises titanium nitride.

16. The method of claim 13, wherein a material of the first metal layer comprises aluminum.

17. The method of claim 13, further comprising:
   removing the first sandwich layer, the first metal layer, the second sandwich layer, the first capping layer, and the second metal layer; and
   nitriding the oxide layer.

* * * * *